United States Patent
Franklin et al.

(10) Patent No.: US 8,741,756 B2
(45) Date of Patent: *Jun. 3, 2014

(54) CONTACTS-FIRST SELF-ALIGNED CARBON NANOTUBE TRANSISTOR WITH GATE-ALL-AROUND

(75) Inventors: Aaron D. Franklin, Croton on Hudson, NY (US); Shu-jen Han, Cortlandt Manor, NY (US); Joshua T. Smith, Croton on Hudson, NY (US); Paul M. Solomon, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/584,199

(22) Filed: Aug. 13, 2012

(65) Prior Publication Data

US 2014/0045303 A1 Feb. 13, 2014

(51) Int. Cl.
*H01L 21/4763* (2006.01)

(52) U.S. Cl.
USPC .... 438/589; 438/619; 257/E51.04; 257/E21.4

(58) Field of Classification Search
USPC .............. 257/E21.4, E21.483, E21.532
See application file for complete search history.

(56) References Cited

U.S. PATENT DOCUMENTS

| | | | |
|---|---|---|---|
| 6,891,227 B2 | 5/2005 | Appenzeller et al. | |
| 7,253,434 B2 | 8/2007 | Golovchenko et al. | |
| 7,646,045 B2 | 1/2010 | Kreupl et al. | |
| 7,714,386 B2 | 5/2010 | Pesetski et al. | |
| 7,952,088 B2 | 5/2011 | Anderson et al. | |
| 8,003,453 B2 | 8/2011 | Avouris et al. | |
| 8,008,160 B2 | 8/2011 | Cheng et al. | |
| 8,097,515 B2 | 1/2012 | Bangsaruntip et al. | |
| 8,106,383 B2 | 1/2012 | Jenkins et al. | |
| 8,173,993 B2 | 5/2012 | Bangsaruntip et al. | |
| 8,288,759 B2 | 10/2012 | Chen et al. | |
| 2004/0043527 A1* | 3/2004 | Bradley et al. | 438/48 |
| 2009/0149012 A1 | 6/2009 | Brask et al. | |
| 2009/0160009 A1 | 6/2009 | Dietz et al. | |
| 2009/0224230 A1* | 9/2009 | Pesetski et al. | 257/24 |
| 2010/0038628 A1 | 2/2010 | Afzali-Ardakani et al. | |
| 2010/0099815 A1 | 4/2010 | Rinzler et al. | |
| 2011/0133169 A1* | 6/2011 | Bangsaruntip et al. | 257/38 |
| 2011/0309334 A1 | 12/2011 | Chang et al. | |
| 2012/0007054 A1 | 1/2012 | Chang et al. | |
| 2012/0056161 A1 | 3/2012 | Avouris et al. | |
| 2012/0175594 A1 | 7/2012 | Chen et al. | |

(Continued)

OTHER PUBLICATIONS

L. Ding, et al., "Self-Aligned U-Gate Carbon Nanotube Field-Effect Transistor with Extremely Small Parastic Capacitance and Drain-Induced Barrier Lowering," ACS Nano, vol. 5, 2011, pp. 2512-2519.

(Continued)

*Primary Examiner* — Cheung Lee
(74) *Attorney, Agent, or Firm* — Cantor Colburn LLP; Vazken Alexanian

(57) ABSTRACT

A method of fabricating a semiconducting device is disclosed. A carbon nanotube is deposited on a substrate of the semiconducting device. A first contact on the substrate over the carbon nanotube. A second contact on the substrate over the carbon nanotube, wherein the second contact is separated from the first contact by a gap. A portion of the substrate in the gap between the first contact and the second contact is removed.

20 Claims, 4 Drawing Sheets

(56) References Cited

U.S. PATENT DOCUMENTS

| | | |
|---|---|---|
| 2012/0228557 A1 | 9/2012 | Shin et al. |
| 2012/0292602 A1 | 11/2012 | Guo et al. |
| 2012/0298949 A1 | 11/2012 | Chang et al. |
| 2012/0326126 A1 | 12/2012 | Chen et al. |

OTHER PUBLICATIONS

A. Javey, et al., "Self-Aligned Ballistic Molecular Transistor and Electrically Parallel Nanotube Arrays," Nano Lett., vol. 4, 2004, pp. 1319-1322.

Kovacs, et al., "Bulk Micromachining of Silicon," Proceedings of the IEEE, vol. 86, Issue 8, Aug. 1998, pp. 1536-1551.

A. Zhang, et al., "Self-Aligned Ballistic n-Type Single-Walled Carbon Nanotube Field-Effect Transistors with Adjustable Threshold Voltage," Nano Lett., vol. 8, 2008, pp. 3696-3701.

D. Guo, et al., "Self-Aligned Carbon Electronics with Embedded Gate Electrode," U.S. Appl. No. 13/111,615, filed May 19, 2011, not yet published.

P. Avouris, et al., "Progress in Carbon Nanotube Electronics and Photonics," MRS Bulletin, vol. 35, Issue 04, Apr. 2012, pp. 306-313.

J. Chen, et al., "Charge Transferred Doping and Electroluminscence in Carbon Nanotube Transistors," 5th IEEE Conference on Jul. 11-15, 2005, vol. 1, pp. 422-425.

R. Cheng, et al., "High-Frequency Self-Aligned Graphene Transistors with Transferred Gate Stacks," PNAS, vol. 109, No. 29, Jul. 17, 2012, pp. 11588-11592.

D. Farmer, et al., "Graphene Field-Effect Transistors with Self-Aligned Gates," Applied Physics Letters, vol. 97, Issue 1, 2010, 013103, 3 pages.

A. Franklin, et al., "Contacts-First Self-Aligned Carbon Nanotube Transistor with Gate-All-Around," U.S. Appl. No. 13/584,199, filed Aug. 13, 2012.

Z Hailiang, et al., "Performance Optimization of MOS-Like Carbon Nanotube-FETs with Realistic Source/Drain Contacts Based on Electrostatic Doping," vol. 31, No. 12, 2010, 124005, 6 pages.

S. Koswatta, et al., "Computational Study of Carbon Nanotube p-i-n Tunnel FETs," IEEE International Electron Devices Meeting, 2005. IEDM, Dec. 5, 2005, pp. 518-521.

L. Liao, et al., "High-Speed Graphene Transistors with a Self-Aligned Nanowire Gate," Nature, vol. 467, 2010, pp. 305-308.

Franklin, A. et al.; Scalable and Fully Self-Aligned n-Type Carbon Nanotube Transistors with Gate-All-Around, 2012 IEEE International Electron Devices Meeting, San Francisco, CA., IEEE, Dec. 10, 2012, pp. 4.5.1-4.5.4.

International Search Report and Written Opinion dated Jan. 22, 2014 for International Application PCT/US13/55270.

\* cited by examiner

CONTACTS-FIRST SELF-ALIGNED CARBON NANOTUBE TRANSISTOR WITH GATE-ALL-AROUND

BACKGROUND

The present disclosure relates to semiconductor devices and, in particular, to carbon nanotube transistors and methods of manufacturing carbon nanotube transistors.

Carbon nanotube field effect transistors (CNT FETs) can provide low-voltage performance with channel lengths scaled into the sub-10 nanometer (nm) regime. However, CNT FETs typically employ impractical gate geometries. A self-aligned gate structure is useful in order to use CNT FETs in highly integrated digital applications. A self-aligned device ensures uniformity of key parameters such as parasitic capacitance, thus enabling uniform operation of the transistors across a chip.

SUMMARY

According to one embodiment, a method of fabricating a semiconducting device includes: forming a carbon nanotube on a substrate; forming a first contact on the substrate over the carbon nanotube; forming a second contact on the substrate over the carbon nanotube, wherein the second contact is separated from the first contact by a gap; and removing a portion of the substrate in the gap between the first contact and the second contact.

According to another embodiment, a method of fabricating a transistor includes: depositing a carbon nanotube material on a substrate; forming one or more contacts on the substrate to define a gap between the one or more contacts; and removing a portion of the substrate in the gap.

According to another embodiment, a method of making a self-aligned carbon nanotube transistor includes: forming a carbon nanotube on a substrate; forming a source contact on the substrate over the carbon nanotube; forming a drain contact on the substrate over the carbon nanotube, wherein the drain contact is separated from the source contact by a gap; and removing a portion of the substrate in the gap between the source contact and the drain contact.

Additional features and advantages are realized through the techniques of the present disclosure. Other embodiments and aspects of the disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

The subject matter which is regarded as the disclosure is particularly pointed out and distinctly claimed in the claims at the conclusion of the specification. The foregoing and other features, and advantages of the disclosure are apparent from the following detailed description taken in conjunction with the accompanying drawings in which:

DETAILED DESCRIPTION

FIGS. 1-6 show various stages of production or manufacture of an exemplary semiconductor device of the present disclosure. In an exemplary embodiment, the semiconductor device is a carbon nanotube field effect transistor (CNT FET). The exemplary method of manufacturing the CNT FET disclosed herein produces self-aligned CNT FETs as a result of depositing the source and drain contacts prior to gate formation, and forming the gate with respect to the deposited source and drain contacts. The source and drain contacts provide a mask with respect to etchant used in gate formation and provide anisotropic etching that defines at least one dimension of the gate region. Additionally, the gate region includes a carbon nanotube bridge that extends between source and drain contacts. The gate material is deposited to surround the CNT bridge circumferentially.

Figure 1:
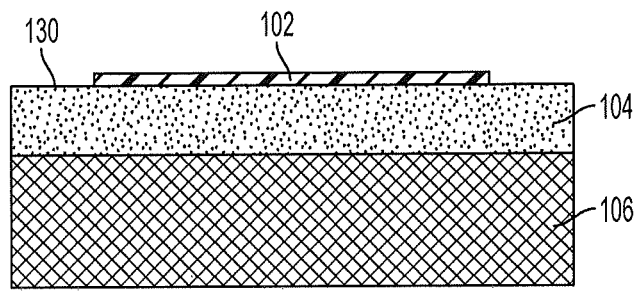
FIG. 1 illustrates an initial production stage of an exemplary carbon nanotube field effect transistor of the present disclosure.

FIG. 1 shows a carbon nanotube 102 placed at a selected location on a substrate at an initial production stage of the exemplary CNT FET. In the exemplary embodiment, the substrate may be a silicon-on-insulator wafer that includes a top layer or silicon layer 104 on top of an insulating layer such as a BOX (buried oxide) layer 106 that may include silicon-dioxide. The carbon nanotube 102, which serves as a transistor device channel, is deposited on surface 130 of the silicon layer 104. In various embodiments, the carbon nanotube 102 is a semiconducting material.

Figure 2:
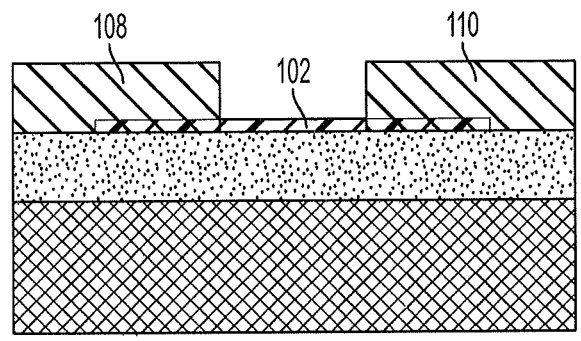
FIG. 2 shows a first contact and a second contact formed on a substrate in a second production stage of the exemplary carbon nanotube field effect transistor.

FIG. 2 shows a first contact 108 and a second contact 110 formed on the silicon substrate 104 in a second production stage. Each of the first contact 108 and the second contact 110 may be deposited on the substrate to cover a portion of the carbon nanotube bridge 102 between contact and the substrate 104. The first contact 108 and the second contact 110 are separated by a selected distance or gap. The first contact 108 and second contact 110 may be formed on the substrate using various techniques for aligning the transistor contacts at selected distance or gap. An exemplary method of forming the first contact 108 and the second contact 110 may include using lithography and lift-off techniques. Alternately, a blanket layer of contact material may be deposited and the selectively etched. In one embodiment, the covered portions of the carbon nanotube may be axial ends of the carbon nanotube. In an exemplary embodiment, one of the first contact 108 and the second contact 110 is a source contact of the completed CNT FET and the other of the first contact 108 and the second contact 110 is a drain contact of the completed CNT FET. In one embodiment, at least one of the first contact 108 and second contact 110 includes a conductive metal such as palladium (Pd).

Figure 3:
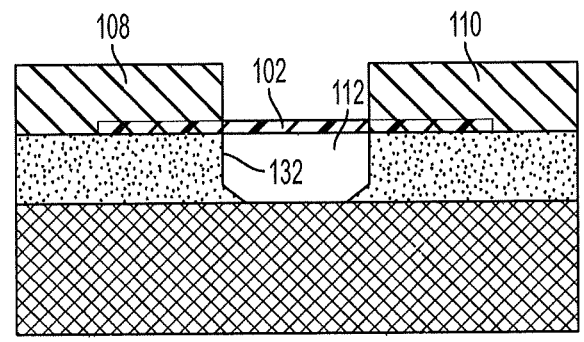
FIG. 3 illustrates a substrate etching stage.

FIG. 3 shows a recess 112 formed in the silicon layer 104 of the substrate. In various embodiments, the surface 130 of the substrate 104 is a surface that can be effectively etched using a wet etchant. For a silicon layer, an exemplary surface may be a (110) surface, wherein (110) represents Miller indices denoting a direction of a crystallographic plane or surface. A surface 132 that is perpendicular to the (110) surface (such as a (111) surface) is also shown. Wet etchant generally dissolves surface 130 relatively effectively, while surface 132 is generally resistant to wet etching. Exemplary wet etchants include potassium hydroxide (KOH), tetramethylammonium hydroxide (TMAH), etc. The first contact 108 and second contact 110 provide an etch mask that protects the silicon beneath the contacts during etching. Applying the contacts 108 and 110 prior to wet etching allows the contacts to define the gate region of the resulting transistor by the selected separation distance of the contacts 108 and 110 and to produce a self-aligned gate. Wet etching therefore creates a recess 112 in a volume between the contacts. In an exemplary embodiment, the recess 112 is etched to the surface of the insulator layer 106. Additionally, due to the orientation of the reactive surface 130 and the resistive surface 132, the substrate layer is etched anisotropically. Etching the recess 112 yields a suspended CNT, otherwise referred to herein as a CNT bridge or a CNT channel, that extends from the first contact 108 to the second contact 110.

Figure 4:
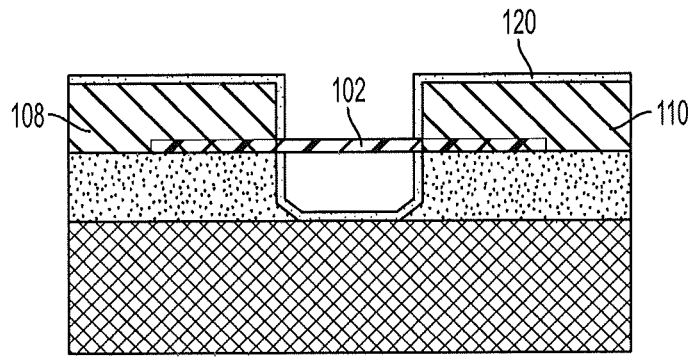
FIG. 4 illustrates a coating stage in which a spacer material is deposited.

FIG. 4 illustrates a coating stage in which a spacer material 120 is deposited. The spacer material 120 is deposited on the exposed surfaces to provide an insulating layer between a subsequently formed gate material and the first and second contacts 108 and 110. The spacer material 120 may be a low-k dielectric material, wherein k is a dielectric constant. Exemplary spacer material may include $SiO_2$ and SiCOH among others. In general, the spacer material adheres to the contacts 108 and 110 as well as the substrate 104 and BOX layer 106 but does not adhere to the CNT bridge during deposition. The spacer may be formed using atomic layer deposition (ALD) or chemical vapor deposition (CVD), for example.

Figure 5:
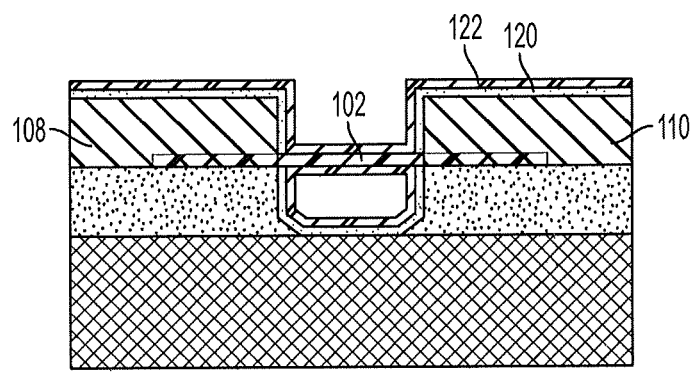
FIG. 5 shows a high-k gate dielectric deposition stage.

FIG. 5 shows a high-k dielectric deposition stage. A high-k dielectric material 122 is then deposited to conform to the exposed surfaces. The high-k dielectric material 122 nucleates on and annularly coats the CNT bridge 102 between the first contact 108 and the second contact 110, thereby providing a gate dielectric material configured to operate at the CNT bridge. The high-k material separates that gate metal (see FIG. 6) from the carbon nanotube bridge. The high-k dielectric material may be deposited using, for example, ALD. Exemplary high-k dielectric material may include $HfO_2$ and $Al_2O_3$, among others.

Figure 6:
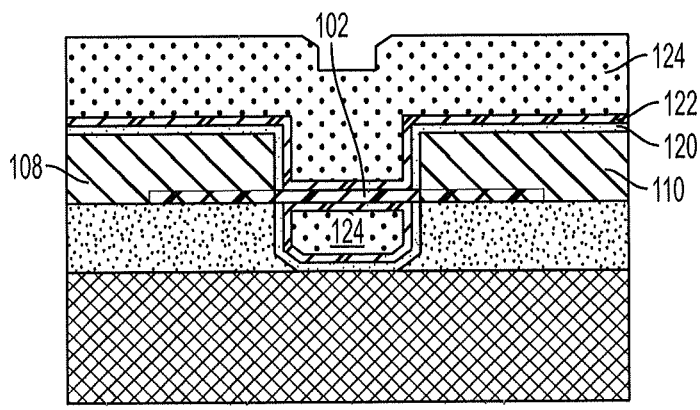
FIG. 6 illustrates a conductive gate deposition stage for building a gate-all-around transistor structure.

FIG. 6 illustrates a gate deposition stage. Once the high-k dielectric material is deposited, a gate material is deposited. The gate material may be a metal such as palladium (Pd), tungsten (W) or other suitable gate metal. The gate metal may be deposited using atomic layer deposition, sputtering techniques or other known techniques or combination of techniques. After deposition, a portion of the gate metal is disposed the volume between the first contact 108 and the second contact 110 including the etched recess 112. The gate therefore surrounds the carbon nanotube bridge on all sides, forming a gate-all-around transistor. The gate-all-around geometry is enabled by the formation of the suspended nanotube bridge during the etching stage. The gate-all-around geometry reduces an impact of stray change and/or adsorbed molecules.

During the gate deposition, some portion of the deposited gate metal may overfill and reside on top of the high-k dielectric surface that coats the first contacts 108 and second contact 110. After the gate metal is deposited, the gate overfill metal may be polished by chemical mechanical planarization/polishing (CMP) as illustrated in FIG. 7, so that the overfilled metal is removed, thereby revealing top surfaces of the first contact (source) 108, gate 124, and second contact (drain) 110.

Figure 7:
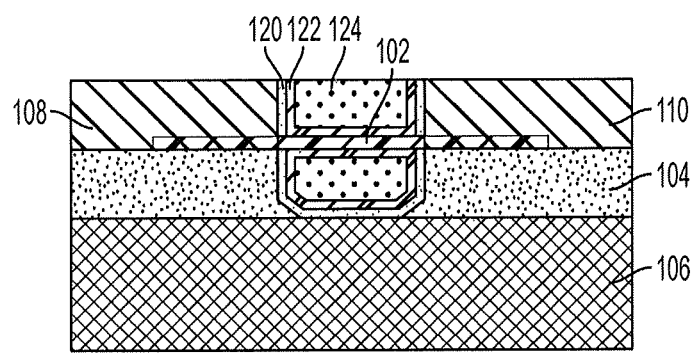
FIG. 7 shows an exemplary carbon nanotube field-effect transistor made using the exemplary methods disclosed herein.
Figure 8:
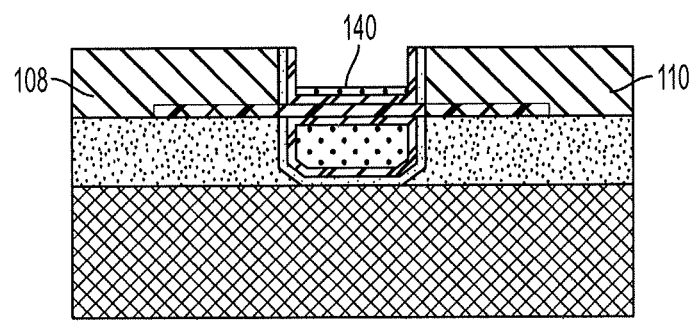
FIG. 8 shows an alternative embodiment of a carbon nanotube field-effect transistor made using the exemplary methods disclosed herein.

FIG. 7 thus depicts an exemplary carbon nanotube field-effect transistor made using the exemplary methods disclosed herein. The exemplary CNT FET includes a substrate, having a carbon nanotube 102 disposed directly thereon. A first (source) contact 108 and a second (drain) contact 110 are disposed on the substrate 104 so that each contact covers a portion of the carbon nanotube between the contact and the substrate 104. The first contact and the second contact are separated by a gap having a selected distance. In various embodiments, the selected distance may be about 30 nanometers. A portion of the carbon nanotube 102 spans the distance between the first contact 108 and the second contact 110 to form a carbon nanotube bridge or carbon nanotube channel. A gate material 124 is deposited in an etched recess between the first contact 108 and the second contact 110 in order and surrounds the carbon nanotube bridge, thereby providing a gate-all-around carbon nanotube transistor. Since the gate formation is related to the source 108 and the drain 110, the transistor is self-aligned. In various embodiments, the gate metal extends to an insulating layer 106 of the substrate. Additionally, the carbon nanotube bridge may be circumferentially surrounded by a high-k dielectric material is formed between the carbon nanotube bridge and the gate metal. In an exemplary embodiment, the surfaces of the source 108, gate 124 and drain 110 are substantially coplanar. In an alternate embodiment, some of the gate metal 124 may be etched so that a top surface 140 of the gate metal is recessed below the top surface defined by the source 108 and drain 110, as shown in FIG. 8. Recessing additional gate metal above the CNT 102 may reduce parasitic capacitances associated with the gate.

In various alternative embodiments, a layer of thin contacts may be made upon their deposition. The contacts may then be topped by a layer of low-k dielectric material, which is polished away during the polishing of the gate metal overfill. In another alternative embodiment, depositing low-k spacer material may be skipped. Instead, high-k dielectric is deposited as both spacer metal and gate dielectric. The high-k dielectric coats the carbon nanotube bridge to conform to the carbon nanotube bridge.

Figure 9:
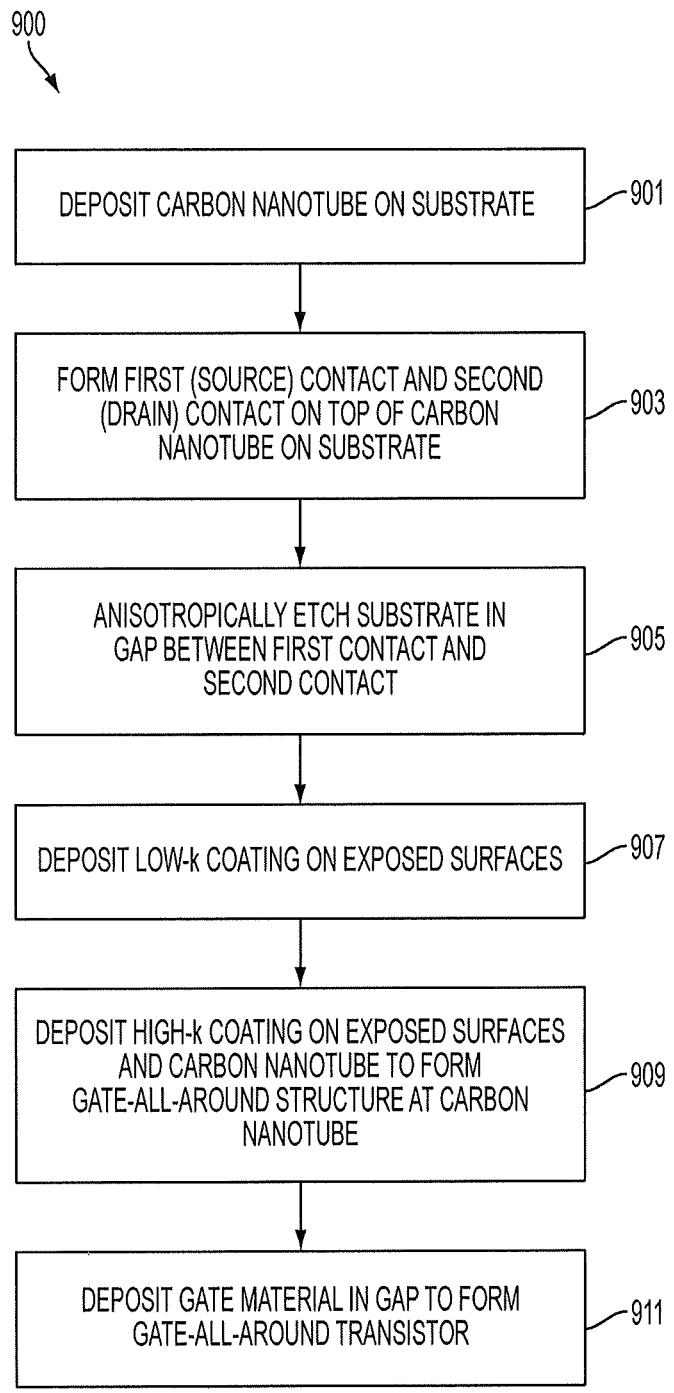
FIG. 9 shows a flowchart illustrating an exemplary method of producing the exemplary carbon nanotube field effect transistor disclosed herein.

FIG. 9 shows a flowchart 900 illustrating an exemplary method of producing a CNT FET disclosed herein. In box 901, a carbon nanotube is deposited on a substrate. In various embodiments, the carbon nanotube is a semiconducting material. The substrate generally resides on an insulating layer (BOX layer). In box 903, source and drain contacts are formed on the substrate. The source and drain contacts are formed on top of portions of the carbon nanotube and are separated from each other by a selected distance to provide a gap for deposition of a gate metal. In box 905, the substrate between the source and drain contacts are wet etched to create a recess between the source and drain contacts. The wet etching process leaves the carbon nanotube which thereby forms a carbon nanotube bridge between the source and drain. The substrate is etched to the BOX layer in an exemplary embodiment. In box 907, a low-k material is deposited on the exposed surfaces to provide a spacer between the gate and each of the source and drain contacts. In box 909, a high-k material is deposited on the exposed surfaces and the carbon nanotube bridge to annularly coat the carbon nanotube bridge. The high-k dielectric material provides an electrical field to the carbon nanotube bridge when a voltage is applied at the gate. In box 911, gate material is deposited (sputtered) on to the transistor to fill in the recess in the substrate and volume between the source and drain contacts. The deposited gate material forms a gate all around the carbon nanotube bridge.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The flow diagrams depicted herein are just one example. There may be many variations to this diagram or the steps (or operations) described therein without departing from the spirit of the disclosure. For instance, the steps may be performed in a differing order or steps may be added, deleted or modified. All of these variations are considered a part of the claimed disclosure.

While exemplary embodiments of the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. A method of fabricating a semiconducting device, comprising:
   forming a carbon nanotube on a substrate;
   forming a first contact on the substrate over the carbon nanotube;
   forming a second contact on the substrate over the carbon nanotube, wherein the second contact is separated from the first contact by a gap;
   removing a portion of the substrate to form a recess in the substrate in the gap between the first contact and the second contact; and
   depositing a gate material of the semiconducting device to fill the recess.

2. The method of claim 1, wherein removing the substrate in the gap between the first contact and the second contact forms a carbon nanotube bridge over the recess.

3. The method of claim 2, further comprising depositing the gate material of the semiconducting device in the gap to define a gate that surrounds the carbon nanotube bridge.

4. The method of claim 3, further comprising depositing high-k dielectric material annularly on the carbon nanotube bridge prior to depositing gate material in the recess.

5. The method of claim 3, further comprising polishing the deposited gate material to so as to provide a surface of the gate material coplanar with surfaces of the first contact and the second contact.

6. The method of claim 3, further comprising recessing a portion of the gate material above the carbon nanotube bridge to a level below a top surface of the first and second contacts.

7. The method of claim 1, further comprising forming the first contact and the second contact aligned to provide a self-aligned gate structure of the semiconducting device.

8. The method of claim 1, wherein removing the substrate further comprises anisotropic etching of the substrate.

9. A method of fabricating a transistor, comprising:
   forming a carbon nanotube material on a substrate;
   forming a first contact and a second contact on the substrate and over the carbon nanotube material to define a gap between the first contact and the second contact;
   removing a portion of the substrate in the gap to form a recess in the substrate between the first contact and the second contact; and
   depositing a gate material of the transistor to fill the recess.

10. The method of claim 9, further comprising removing the substrate in the gap to form a carbon nanotube bridge over the recess.

11. The method of claim 10, further comprising depositing gate material of the transistor in the gap to provide a gate material all around the carbon nanotube bridge.

12. The method of claim 11, further comprising depositing a dielectric material annularly conforming to the carbon nanotube bridge prior to depositing gate material in the recess.

13. The method of claim 11, further comprising polishing the deposited gate material to perform one of: providing a surface of the gate material coplanar with surfaces of the one or more contacts.

14. The method of claim 11, further comprising recessing a portion of the gate material above the carbon nanotube bridge to a level below a top surface of the first and second contacts.

15. The method of claim 9, further comprising forming the first contact and the second contact to provide a self-aligned gate structure of the transistor.

16. A method of making a self-aligned carbon nanotube transistor, comprising:
   forming a carbon nanotube on a substrate;
   forming a source contact on the substrate over the carbon nanotube;
   forming a drain contact on the substrate over the carbon nanotube, wherein the drain contact is separated from the source contact by a gap;
   removing a portion of the substrate in the gap to form a recess in the substrate between the source contact and the drain contact; and
   depositing a gate material to fill the recess.

17. The method of claim 16, wherein removing the substrate in the gap between the source contact and the drain contact forms a carbon nanotube bridge over the recess.

18. The method of claim 17, further comprising depositing gate material in the gap to surround the carbon nanotube bridge.

19. The method of claim 18, further comprising depositing conformal high-k dielectric material annularly on the carbon nanotube bridge prior to depositing the gate material in the recess.

20. The method of claim 16, wherein removing the substrate further comprises anisotropic etching of the substrate.

\* \* \* \* \*